United States Patent
Pan

(10) Patent No.: US 10,455,732 B2
(45) Date of Patent: Oct. 22, 2019

(54) LIQUID-COOLED HEAT DISSIPATION APPARATUS

(71) Applicant: KUAN DING INDUSTRIAL CO., LTD., New Taipei (TW)

(72) Inventor: Kuan-Da Pan, New Taipei (TW)

(73) Assignee: KUAN DING INDUSTRIAL CO., LTD., New Taipei (TW)

( * ) Notice: Subject to any disclaimer, the term of this patent is extended or adjusted under 35 U.S.C. 154(b) by 143 days.

(21) Appl. No.: 15/599,064

(22) Filed: May 18, 2017

(65) Prior Publication Data

US 2017/0339802 A1 Nov. 23, 2017

(30) Foreign Application Priority Data

May 20, 2016 (TW) .............................. 105207473 A

(51) Int. Cl.
| | | |
|---|---|---|
| H05K 7/20 | (2006.01) | |
| H01L 23/473 | (2006.01) | |
| F28D 15/00 | (2006.01) | |
| H01L 23/552 | (2006.01) | |
| F28D 21/00 | (2006.01) | |

(52) U.S. Cl.
CPC ......... *H05K 7/20263* (2013.01); *F28D 15/00* (2013.01); *H01L 23/473* (2013.01); *H01L 23/552* (2013.01); *H05K 7/20254* (2013.01); *H05K 7/20272* (2013.01); *F28D 2021/0029* (2013.01)

(58) Field of Classification Search
CPC ... H05K 7/20263; F28D 15/00; H01L 23/473; F04D 29/5866; F04D 1/06; F04D 29/007; F04D 29/22; F04D 29/426; F04D 29/5873

USPC ........................................................ 165/80.4
See application file for complete search history.

(56) References Cited

U.S. PATENT DOCUMENTS

| 6,379,466 | B1 * | 4/2002 | Sahin ................... C23C 16/455 118/715 |
|---|---|---|---|
| 6,876,550 | B2 * | 4/2005 | Sri-Jayantha ......... H01L 23/467 165/121 |
| 7,249,625 | B2 * | 7/2007 | Duan ....................... G06F 1/20 165/104.28 |
| 7,325,591 | B2 * | 2/2008 | Duan ................... H01L 23/473 165/104.33 |

(Continued)

*Primary Examiner* — Raheena R Malik
(74) *Attorney, Agent, or Firm* — Chun-Ming Shih; HDLS IPR Services

(57) ABSTRACT

A liquid-cooled heat dissipation apparatus includes a water cooling module (1), a water pump set (2) and a reservoir tank (3). The water cooling module (1) includes a heat exchange unit (11) and a base (12) having a pump receiving slot (121) and a heat exchange chamber (T). The base (12) includes a water inlet channel (G1), drainage channel (G2) and first channel (G10). The water pump set (2) is arranged inside the pump receiving slot (121) and includes a rotor assembly (21) and a blade assembly (23). The blade assembly (23) is attached onto the rotor assembly (21) and includes a second channel (G20). The reservoir tank (3) is detachably stacked onto the water cooling module (1) and includes a water containing chamber (R) and a water supply channel (G3) formed thereon. Accordingly, the apparatus achieves the effects of independent reservoir, readily water supply and pipeline exhaust simultaneously.

16 Claims, 15 Drawing Sheets

(56) References Cited

U.S. PATENT DOCUMENTS

| | | | | |
|---|---|---|---|---|
| 7,729,118 | B2* | 6/2010 | Lai | H01L 23/473 |
| | | | | 165/104.33 |
| 7,753,662 | B2* | 7/2010 | Lai | F04D 13/0606 |
| | | | | 165/80.4 |
| 8,051,898 | B2* | 11/2011 | Chiang | H01L 23/473 |
| | | | | 165/104.28 |
| 8,550,149 | B2* | 10/2013 | Wang | G06F 1/20 |
| | | | | 165/80.4 |
| 8,746,326 | B2* | 6/2014 | Mou | H01L 23/473 |
| | | | | 165/104.33 |
| 2017/0351305 | A1* | 12/2017 | Wei | F28D 15/00 |

\* cited by examiner

LIQUID-COOLED HEAT DISSIPATION APPARATUS

BACKGROUND OF THE INVENTION

Field of the Invention

The present invention is related to a heat dissipation apparatus, in particular, to a liquid-cooled heat dissipation apparatus used for increasing the overall cooling performance.

Description of Related Art

With the rapid development of electronic industry, the amount of heat generated by the heat generating components, such as central processors and graphic processors etc., inside electronic products, also increases continuously in such a way that conventional heat sinks may even be insufficient for the cooling of such heat generation components and water-cooled heat sinks equipped with liquid cooling circulation effect are required to effectively dissipate the heat generated by the heat generating components. A traditional water-cooled device comprises a water cooling head, a water cooling manifold and a water pump connected to each other. The internal of the water cooling head, the internal of the water cooling manifold and the water pump form a circulation loop, and such circulation loop is filled with a working fluid of water and so on.

The water cooling head is in contact with the heat generation component and uses the working fluid to carry away the heat, the water cooling manifold dissipates the heat to the external in order to cool the working fluid, and the water pump then drives the working fluid to flow inside the circulation loop in cycles.

However, after a long period of use, the working fluid inside the water-cooled device reduces; therefore, the question on how to allow the water-cooled device having the water supply effect and such water supply process having facilitated water supply without wetting other components is one of the key issues for improvement. Furthermore, since heat dissipation devices installed on different electronic devices have different specification requirements, there are numerous different structural designs to cope with various types of specification requirement. Consequently, the question on how to deal with different types of specifications in order to cope with different corresponding requirements is also another key issue for improvement of a water-cooled heat sink.

In view of the above, to achieve the objective, the inventor seeks to provide a reasonable design capable of effectively improving the aforementioned drawbacks after years of researches along with utilization of academic theories and principles.

SUMMARY OF THE INVENTION

A primary objective of the present invention is to provide a liquid-cooled heat dissipation apparatus, having a detachable reservoir tank independently attached onto a water cooling head, and a water pump having channels connected to the reservoir tank and the cooling head in order to allow the cooling circulation liquid to flow inside the loop; therefore, the present invention is able to achieve the technical effects of independent water reservoir and pipeline exhaust at the same time.

To achieve the aforementioned objectives, the present invention provides a liquid-cooled heat dissipation apparatus, comprising a water cooling module and a reservoir tank. The water cooling module comprises a base and a pump receiving slot. The base includes one side formed of a pump receiving slot and another side connected to a heat exchange unit and a heat exchange chamber formed with the heat exchange unit. The base includes a drainage channel connected to the heat exchange chamber and a first channel connected to an internal of the pump receiving slot and the heat exchange chamber. A water pump set is arranged inside the pump receiving slot and comprises a rotor assembly and a blade assembly connected to the rotor assembly for power transmission. The blade assembly is attached onto the rotor assembly and forms a second channel together with the blade assembly in order to connect to an internal of the pump receiving slot. The reservoir tank is detachably stacked onto one side of the water cooling module with the pump receiving slot formed thereon. The reservoir tank includes a water containing chamber and a water supply channel connected to the water containing chamber. The water supply channel is connected to the second channel.

In comparison to the prior arts, the present invention includes at least the following technical effects: the reservoir tank can be made of a transparent material in order to allow observation of the water level readily for supplying of water; in addition, the reservoir is of an independent and separable structural design such that its configuration and design can be modified according to demands of different modularizations in order to achieve the objectives of providing a design having independent water reservoir, pipeline exhaust, readily water supply and high flexibility.

DETAILED DESCRIPTION OF THE INVENTION

Figure 1:
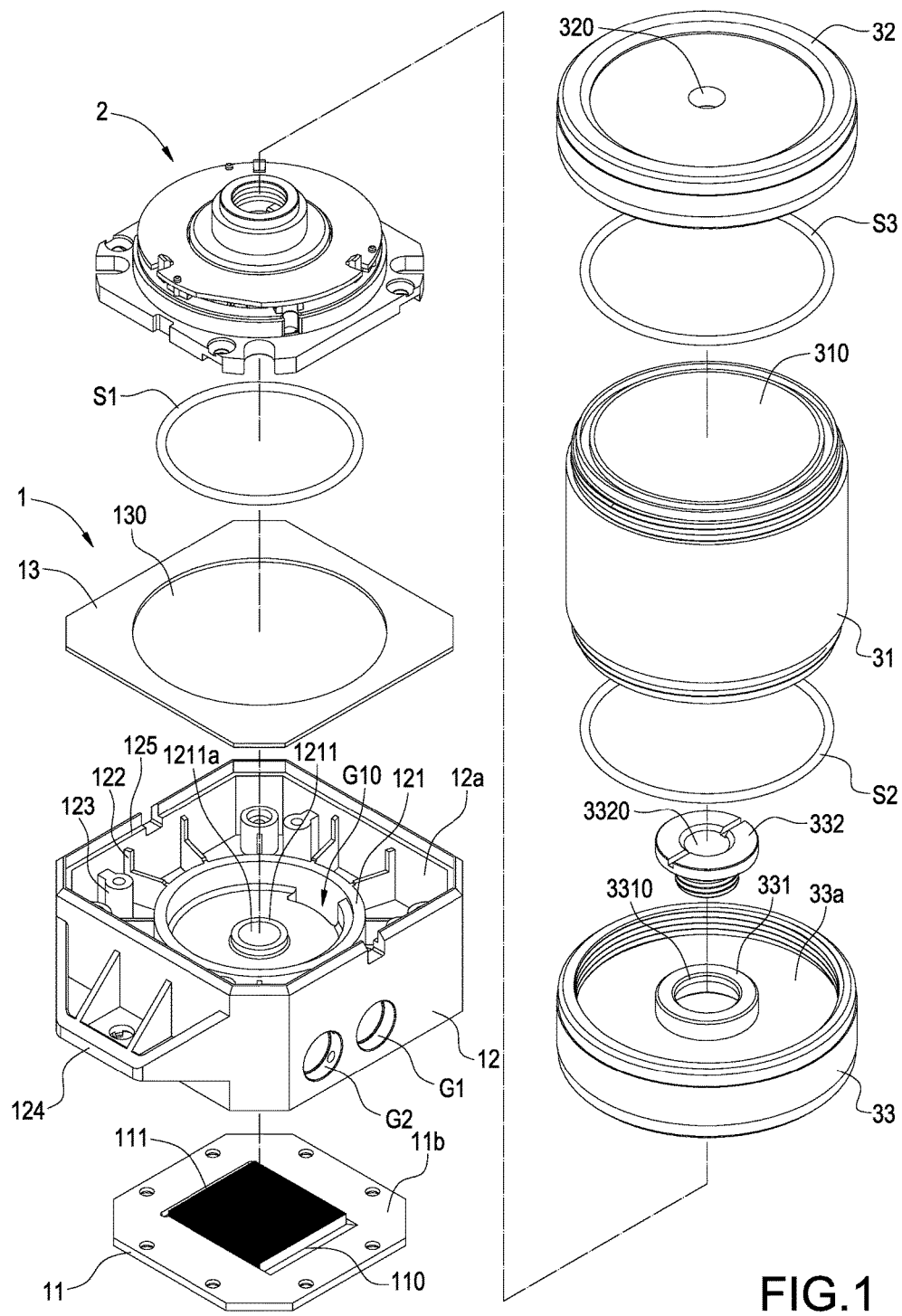
FIG. 1 is a perspective exploded view of the first embodiment of the present invention.

The following provide a detailed description on the technical content of the present invention along with the accompanied drawings. However, it shall be understood that the drawings are provided for illustration purposes only rather than to limit the scope of the present invention.

As shown in FIG. 1 to FIG. 7, the present invention provides a liquid-cooled heat dissipation apparatus, comprising a water cooling module 1 and a reservoir tank 3, wherein the reservoir tank 3 is detachably stacked onto the water cooling module 1, and the water cooling module 1 includes a water pump set 2. The water cooling pump assembly 2 is arranged between the water cooling module 1 and the reservoir tank 3.

The water cooling module 1 includes a base 12 and a heat exchange unit 11 connected to the base 12. The two upper and lower sides of the base 12 include an upper slot 12a and a lower slot 12b formed thereon respectively. In addition, an outer circumferential wall at one side of the base 12 includes a water inlet channel G1 and a drainage channel G2, wherein the upper slot 12a includes a pump receiving slot 121 formed therein, and a fitting sleeve 1211 is informed inside the pump receiving slot 121. The fitting sleeve 1211 includes a sleeve hole 1211a connected to the water inlet channel G1. A plurality of carrying portions 122 are arranged radially on the pump receiving slot 121 and extended to the upper slot 12a; in addition, a positioning portion 123 is arranged between the pluralities of carrying portions 122.

According to the above, the center area of the lower slot 12b includes a cavity 1211b indented inward thereon, and the lower slot 12b includes a plurality screw holes (not shown in the drawings) formed at an outer circumference of the cavity 1211b in order to allow the heat exchange unit 11 to be fastened onto the base 12. Furthermore, the heat exchange unit 11 can be metal plate or a vapor chamber unit, and the present invention is not limited any particular types thereof. In this embodiment, the example of metal plate is used for illustration. One side of the metal plate corresponding to the base 12 is formed of an indented slot 110 by using a cutting tool, and the bottom side surface of the indented slot 110 is a heat exchange surface 11b, whereas the other side thereof is a thermal contact surface 11a for contacting with a heat generation source, such as a central processor a graphic processor. In addition, the indented slot 110 and the cavity 1211b of the base 12 together form a space of a heat exchange chamber T, which is connected to the drainage channel G2. The surface of the pump receiving slot 121 extended between the pump receiving slot 121 to the fitting sleeve 1211 is formed of a first channel G10 connected to the internal of the pump receiving slot 121 and the heat exchange chamber T such that the drainage channel G2, heat exchange chamber T, the first channel G10 and the pump receiving slot 121 are all connected to each other. To be more specific, the channel entrance location where the first channel G10 is connected to the heat exchange chamber T is arranged at the location away from the channel entrance where the drainage channel G2 is connected to the heat exchange chamber T in order to allow the cooling water entering into the heat exchange chamber T from the water inlet channel G1 can flow through the entire heat exchange surface 11b completely.

According to the above, the aforementioned metal plate can include a plurality of fins 111 formed inside the indented slot 110 and arranged spaced apart from each other in parallel, and the gaps among the fins becomes the cooling water channels such that the thermal conduction surface is increased. In addition, the water cooling module 1 further includes a separation plate 13, and the separation plate 13 includes a separation plate attachment hole 130 and is arranged on an inner circumferential wall 125 of the upper slot 12a. The carrying portion 122 extends from the inner wall of the upper slot 12b toward the direction of the pump receiving slot 121 to form a sheet of stepped structure. The positioning portion 122 includes the plurality of screw holes (not shown in the drawings) connected to the lower slot 12b and provided for fastening the portion of the heat exchange unit 11 and for fastening the portion of the water pump set 2. Furthermore, the outer circumferential walls at two sides of the base 12 include a wing portion 124 extended therefrom. The wing portion 124 can be formed of holes for allowing the water cooling module 2 to be secured onto the electronic device; however, the present invention is not limited to such configuration only.

The water pump set 2 comprises a rotor assembly 21, a stator assembly 22 and a blade assembly 23; however, since the driving principle and method among the three elements are not the key features of the present invention, details thereof are omitted. The rotor assembly 21 comprises a rotor seat 211, a rotor sleeve 212 protruding on the rotor seat 211 and a rotating axle 213 arranged inside the rotor sleeve 212. The rotor seat 211 includes a stator receiving slot 2110 formed at one side corresponding to the stator assembly 22 and circumferencing the rotor sleeve 212, and it also includes an attachment slot 212b formed at another side corresponding to the blade assembly 23. The rotor sleeve 212 includes a sleeve hole 212a formed thereon for connecting to the attachment slot 212b.

According to the above, the stator assembly 22 includes a stator seat 221 and an attachment hole 2210 formed at a center of the stator seat 211. In addition, a plurality of stators 222 arranged to surround the attachment hole 2210 and arranged at an inner wall of the stator seat 221. The attachment hole 2210 is provided for the rotor sleeve 212 to penetrate therein in order to allow the stator seat 221 to be positioned inside the stator receiving slot 2110.

Figure 3:
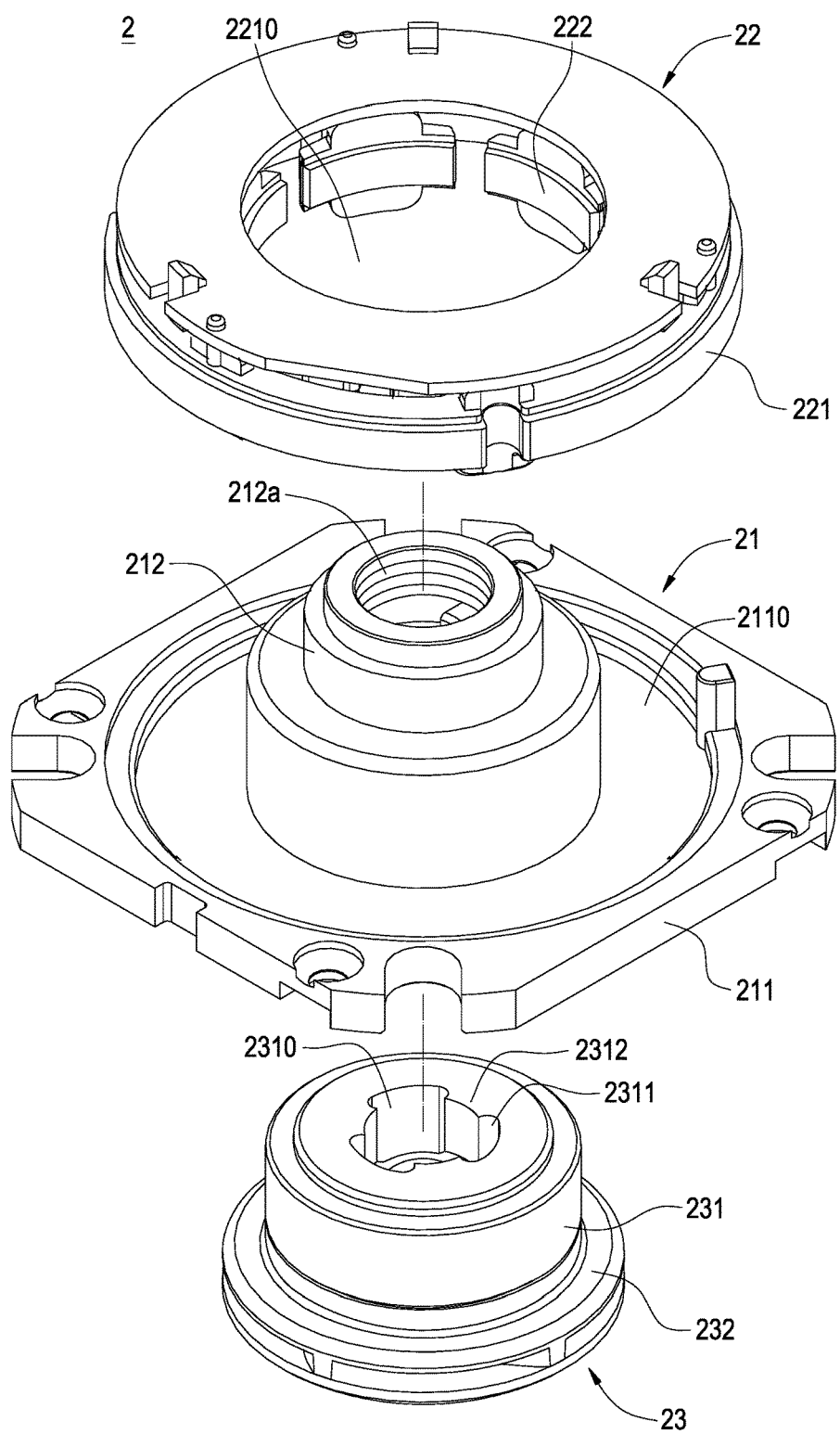
FIG. 3 is a perspective exploded view of the water pump set of the present invention.
Figure 4:
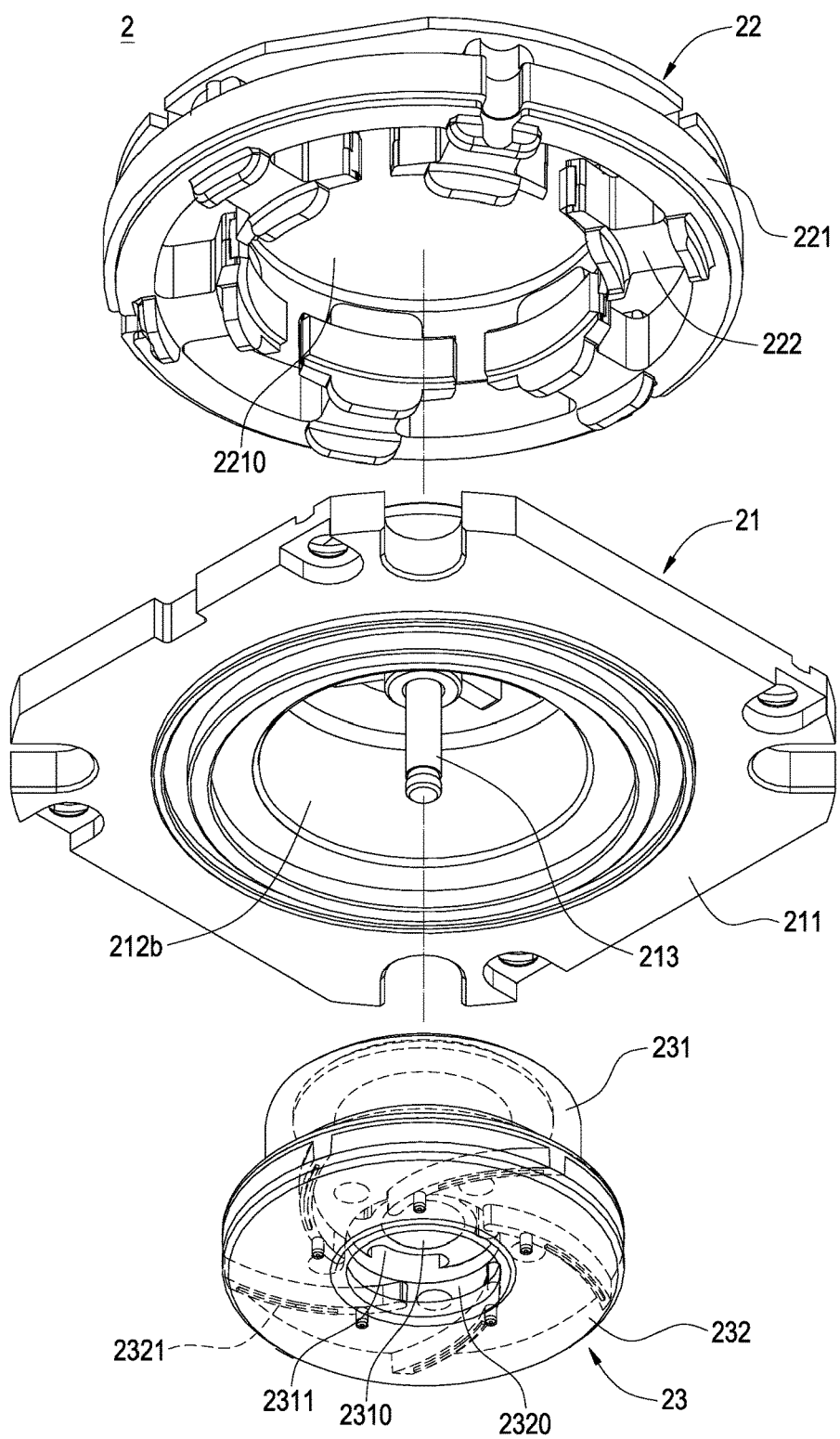
FIG. 4 is another perspective exploded view of the water pump set of the present invention viewed from another angle.
Figure 5:
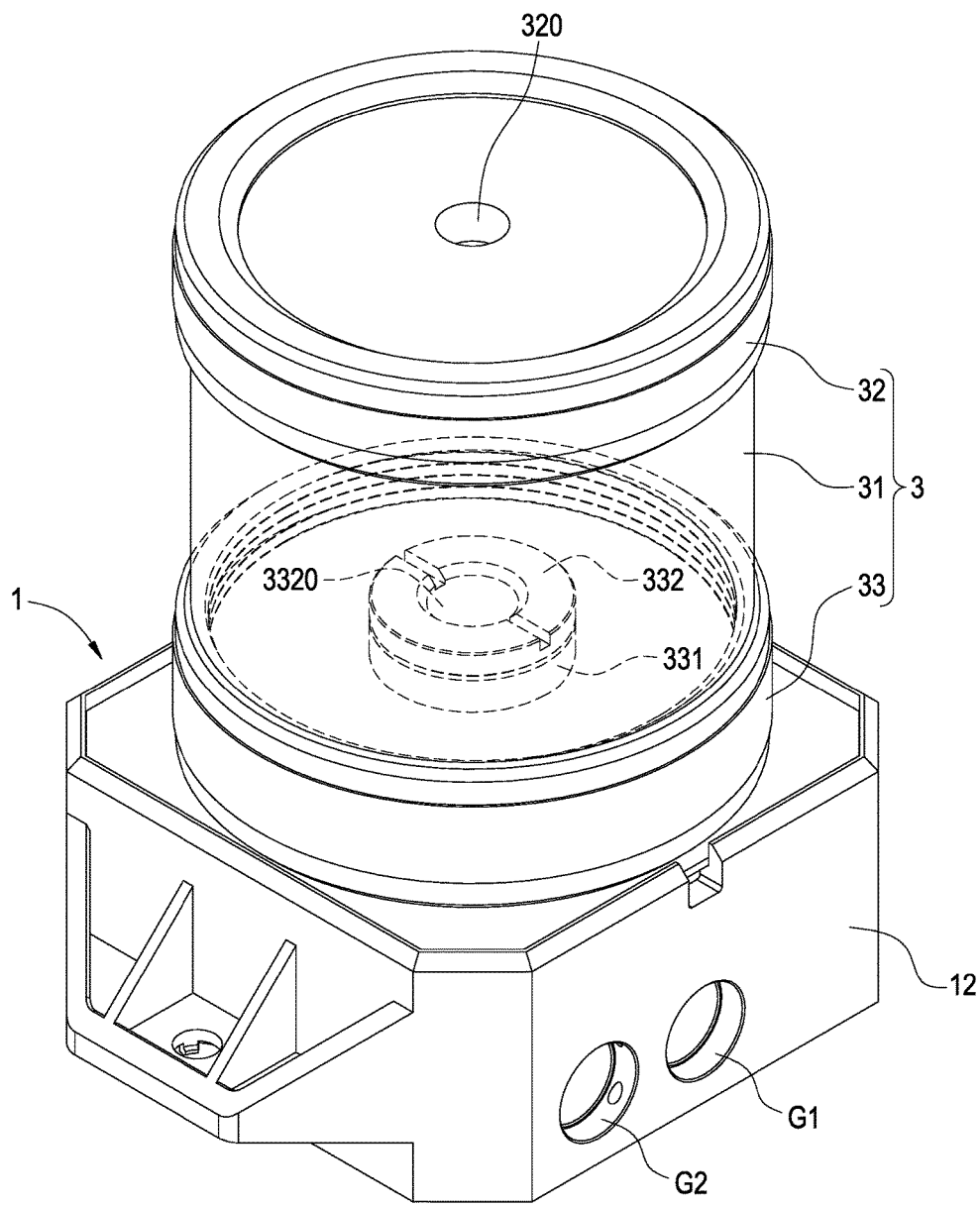
FIG. 5 is an assembly appearance view the first embodiment of the present invention.
Figure 6:
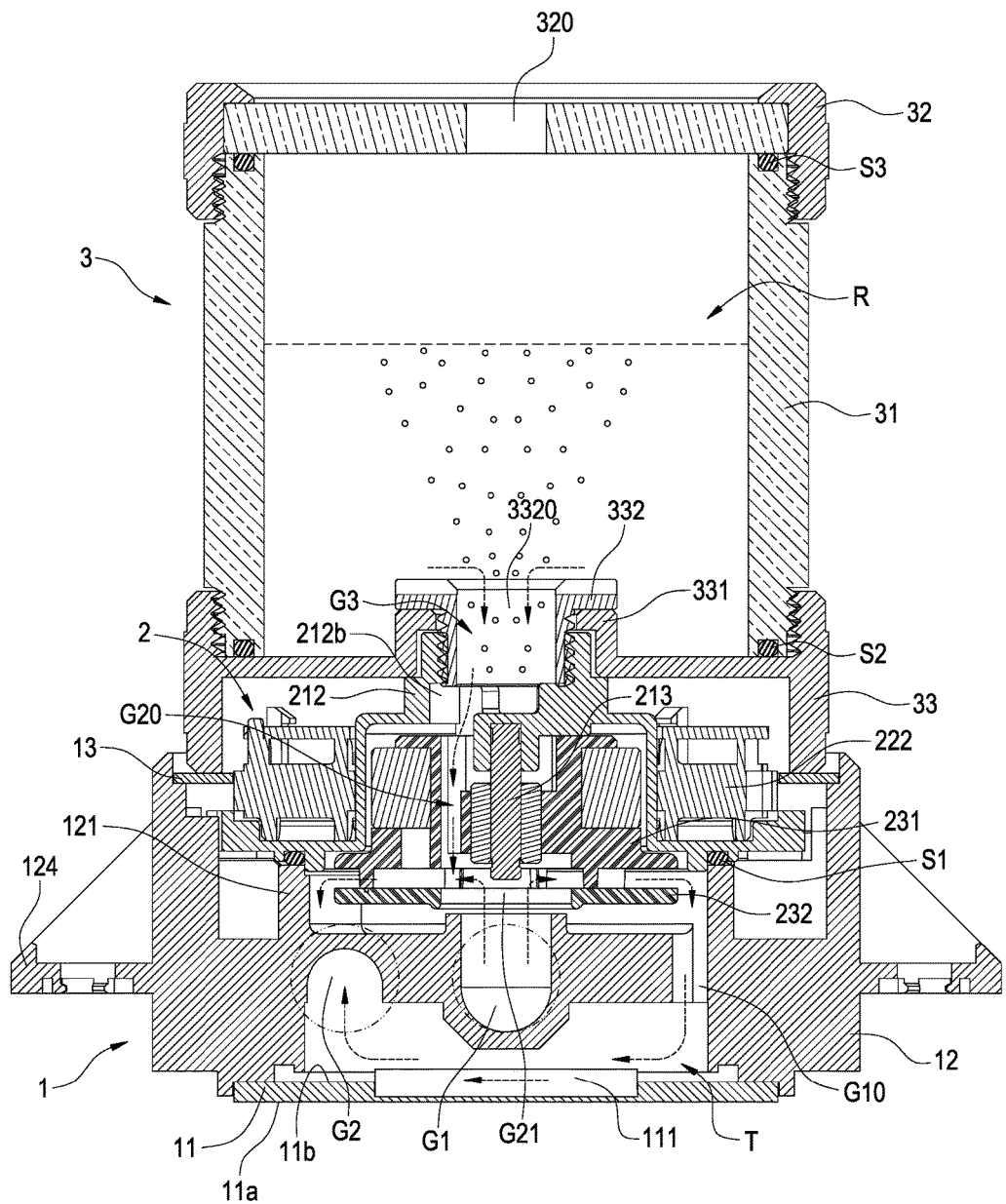
FIG. 6 is an assembly cross-sectional view of the first embodiment of the present invention.
Figure 7:
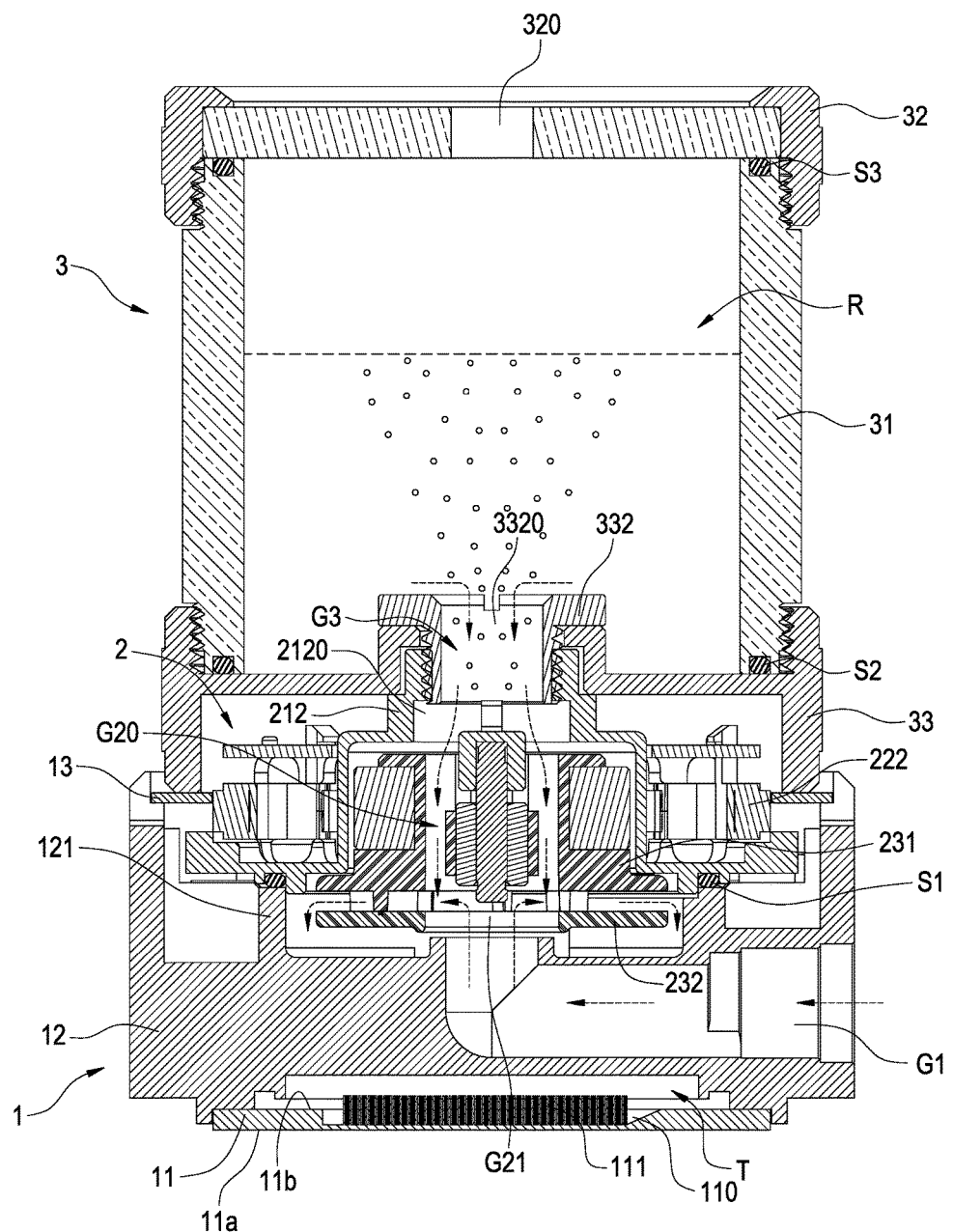
FIG. 7 is another assembly cross-sectional view of the first embodiment of the present invention.

According to the above, the blade assembly 23 includes a blade base 231 and a blade disk 232 connected to the blade seat 231. The blade seat 231 includes an axle receiving slot 2310 formed at one side corresponding to the rotor assembly 21, and the blade seat 231 is received inside the attachment slot 212b and the rotating axle 213 penetrates through the axle receiving slot 2310 in order to drive the blade disk 232 to rotate. In addition, the blade disk 232 is configured to include two circular disks arranged spaced apart from each other in parallel and is also formed of a blade through hole 2320 with the rotating axle 213 as a central axle thereof. A plurality of curved blades 2321 are sequentially formed to circumference the outer surrounding of the blade through hole 2320 between the two circular disks. Moreover, at least one channel hole 2311 is formed at the center location of the axle receiving slot 2310 of the blade seat 2311 and extended from the inner circumferential wall of the axle receiving slot 2310 outward. The channel holes 2311 penetrate through the blade seat 231, as shown in FIG. 3 and FIG. 4, showing three curved channel holes 2311 extended from the inner circumferential wall of the axle receiving slot 2310 outward respectively; however, the present invention is not limited to such quantity and the geometric profile. Furthermore, at least one inner ratchet portion 2312 is formed between the channel holes 2311 of the blade seat and the inner circumferential wall of the axle receiving slot 2310 in order to enhance the water flow turbulence effect during the operation of the water pump set 2.

According to the above, the rotor seat 211 is horizontally placed onto the aforementioned carrying portion 122 and abuts against the plurality of sheet stepped structure, and a sealing gasket S1 is disposed between the two. In addition, the outer circumferential edge of the rotor seat 211 includes a plurality of holes (not shown in the drawings) for the screws to penetrate through such holes and the aforementioned positioning portion 123 in order to fasten the water pump set 2 inside the upper slot 12a of the base 12. Furthermore, the blade disk 232 is arranged inside the pump receiving slot 121, and the channel holes 2311 form a second channel G20. The blade through hole 2320 and the sleeve hole 1211a together form a third channel G21 in order to allow the second channel G20 to connect to the third channel G21, the internal of the pump receiving slot 121, the first channel G10, the heat exchange chamber T, the water inlet channel G1 and the drainage channel G2.

The reservoir tank 3 comprises a housing 31, a bottom shield 33 attached onto one side of the housing 31 corresponding to the water cooling module 1 and a top shield 32 attached onto another side of the housing 31. In this embodiment, the housing 31 is a cylindrical hollow tubular member having two sides formed of openings. In addition, the outer circumferential edge of the housing 31 for attaching with the top shield 32 and the bottom shield 33 is formed of outer threads. The top shield 32 corresponds to the geometric shape of the housing 31 to form a circular cover and its inner circumferential wall is formed of screw threads for fastening onto the housing 31; in addition, a sealing gasket S3 is disposed between the two mentioned above for sealing thereof.

According to the above, the bottom shield 33 also corresponds to the geometric shape of the housing 31 to form a circular cover. The bottom shield 33 includes an upper groove 33a and a lower groove 33b formed at two opposite sides thereof. The inner wall of the upper groove 33a is formed of screw threads for fastening onto the housing 31 and a sealing gasket S2 is disposed therebetween for sealing thereof. The upper grove 33a includes a fitting sleeve 331 therein and arranged corresponding to the location of the rotor sleeve 212 of the water pump set 2. The center of the fitting sleeve 331 includes a fitting through hole 3310 formed at a center thereof for connecting through the upper groove 33a and the lower groove 33b; therefore, the rotor sleeve 212 is able to penetrate into the fitting through hole 3310 in order to be mounted inside the fitting sleeve 331.

According to the above, the reservoir tank 3 further comprises a fastening member 332, the fastening member 332 is a screw structure having a through hole 3320 formed thereon. The inner wall of the aforementioned rotor sleeve 212 is formed of screw threads, and the fastening member 332 penetrates into the fitting through hole 3310 from one side of the upper groove 33a and is fastened onto the rotor sleeve 212 for securement thereof. The through hole 3320 of the fastening member 332 is connected to the attachment slot 212b of the rotor sleeve 212 in order to form a water supply channel G3. To be more specific, the hollow portion of the housing 31 is a water containing chamber R and the housing can be made of a transparent material, and the opening formed on one side of the housing 31 attaching onto the top shield 32 is a water supply opening 310. By removing the top shield, an external water supply channel is formed, or a water supply hole 320 is formed at the top shield 32 and connecting tubes can be connected to the water inlet channel G1 and the water containing chamber R respectively in order to form an internal water supply channel. For the water supply method of the internal water supply channel, please refer to the details described in the following.

Figure 12:
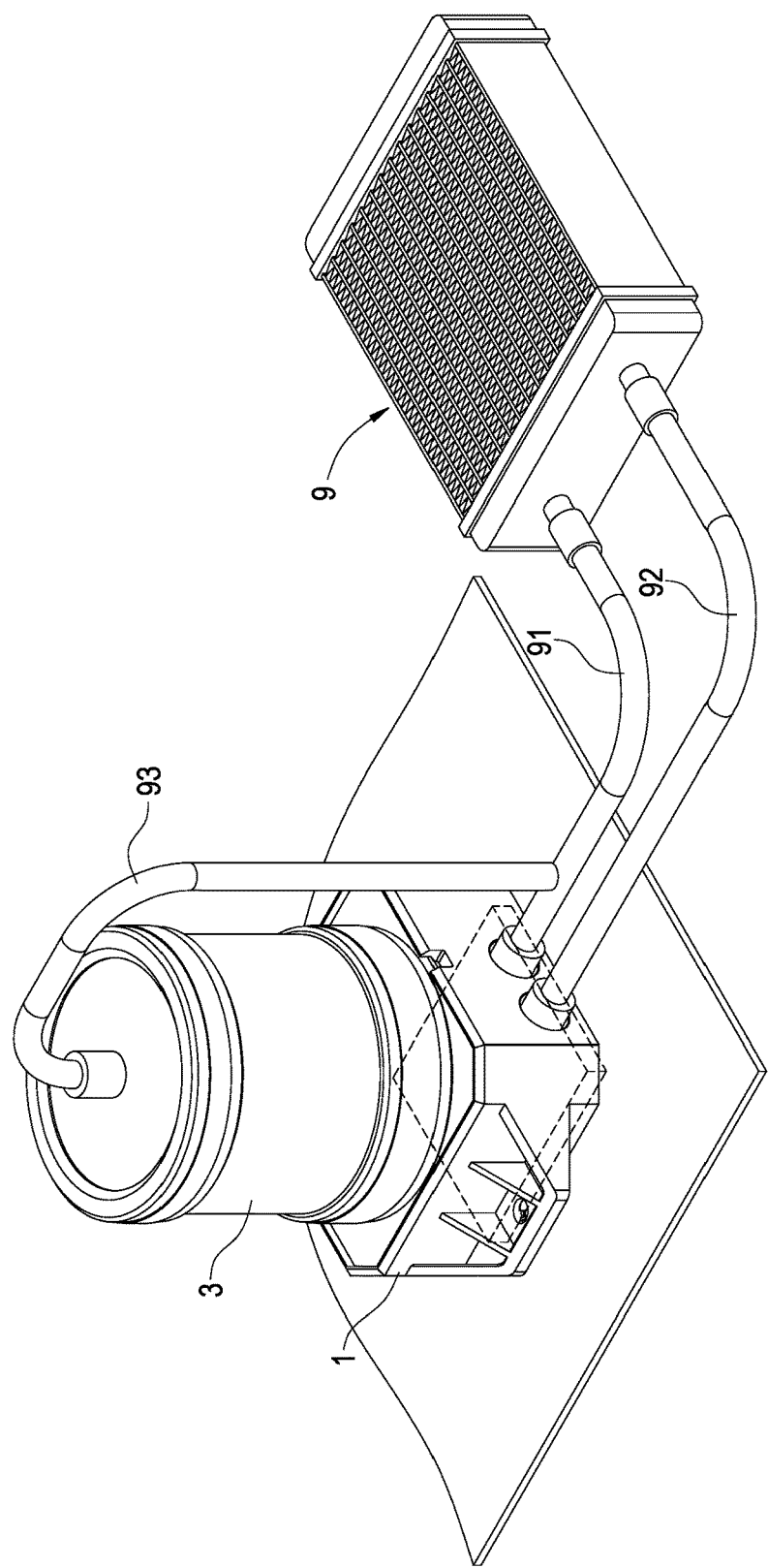
FIG. 12 is a configuration diagram showing the liquid-cooled heat dissipation apparatus of the present invention connected to the water cooling manifold.

Please also refer to FIG. 12. The aforementioned water supply channel G3 is sequentially connected to the water containing chamber R, the second channel G20, the internal of the pump receiving slot 121, the first channel G10 and the drainage channel G2. To be more specific, the water inlet channel G1 is connected to the sleeve hole 1211a of the water cooling module 1, and a gap is formed between the sleeve hole 1211a and the blade disk 232 and corresponding to the location of the blade through hole 2320 such that the water inlet channel G1 is also connected to the internal of the pump receiving slot 121, the first channel G10, the heat exchange chamber T and the drainage channel G2. A water inlet pipe 91 and a drainage pipe 92 can be attached onto the water inlet channel G1 and the drainage channel G2 on the outer wall opening of the base 12 for connecting to an external cooling manifold 9 respectively in order to form a circulation cooling loop. Furthermore, the aforementioned internal water supply channel is to attach a branch pipe 93 onto a water inlet pipe 91 connected to the water inlet channel G1 such that when the water level of the water containing chamber R decreases, the cooling water in the circulation cooling loop and flowing back from the water inlet pie 91 can flow into the water containing chamber R via the branch pipe 93 in order to form an internal water supply channel.

According to the above, in the liquid-cooled heat dissipation apparatus of the present invention, the cooling water is filled into the aforementioned circulation cooling loop and the part of the water containing chamber R is also filled with the cooling water. The stator assembly 22 establishes a magnetic field to drive the blade assembly 23 to rotate in order to guide the cooling water inside the loop to enter into the pump receiving slot 121 via the water inlet channel G1 and to flow collectively into the first channel G10 for entering into the heat exchange chamber T. In addition, the cooling water inside the water containing chamber R is guided by the water supply channel G3 to the second channel G20 in order to enter into the internal of the pump containing slot 121, following which the cooling water collectively flows to the first channel G10 and enters into the heat exchange chamber T. The cooling water is able to absorb the heat from the heat exchange unit 11 and the fins 111, and the cooling water after heat absorption collectively flows to the drainage channel G2 and flows further to the external cooling manifold 9 for cooling, following which the cooling water then flows back to the water inlet channel G1 and/or the branch pipe 93 via the water inlet pipe 91 in order to form a cooling circulation loop.

According to the above, the micro-bubbles generated during the high-speed rotation of the blade immersed in the cooling water 2321 can suspend in the second channel G20 and the water supply channel G3 such that they can flow to the cooling water liquid surface in the water containing chamber R in order to be scattered into the space of the water containing chamber R in order to reduce the excessive amount of micro-bubbles at the blade disk 232 being carried into the pipes, leading to gathering of such bubbles that can affect the entire flow field status inside the circulation cooling loop and even reduce the overall cooling efficiency. Moreover, for the decrease of water level due to heat dissipation for a long period of operation, with the design of the reservoir tank 3 made of a transparent material, the water level of the cooling water in the water containing chamber R can be observed and supplemented readily. Furthermore, with the independent and detachable structural design of the reservoir tank 3, it can be attached onto the water cooling module 1 or configured separately and independently such that the configuration design can be changed according to the needs of different modularization at any time in order to achieve the objectives of providing a design having independent water reservoir, pipeline exhaust, readily water supply and high flexibility.

Figure 8:
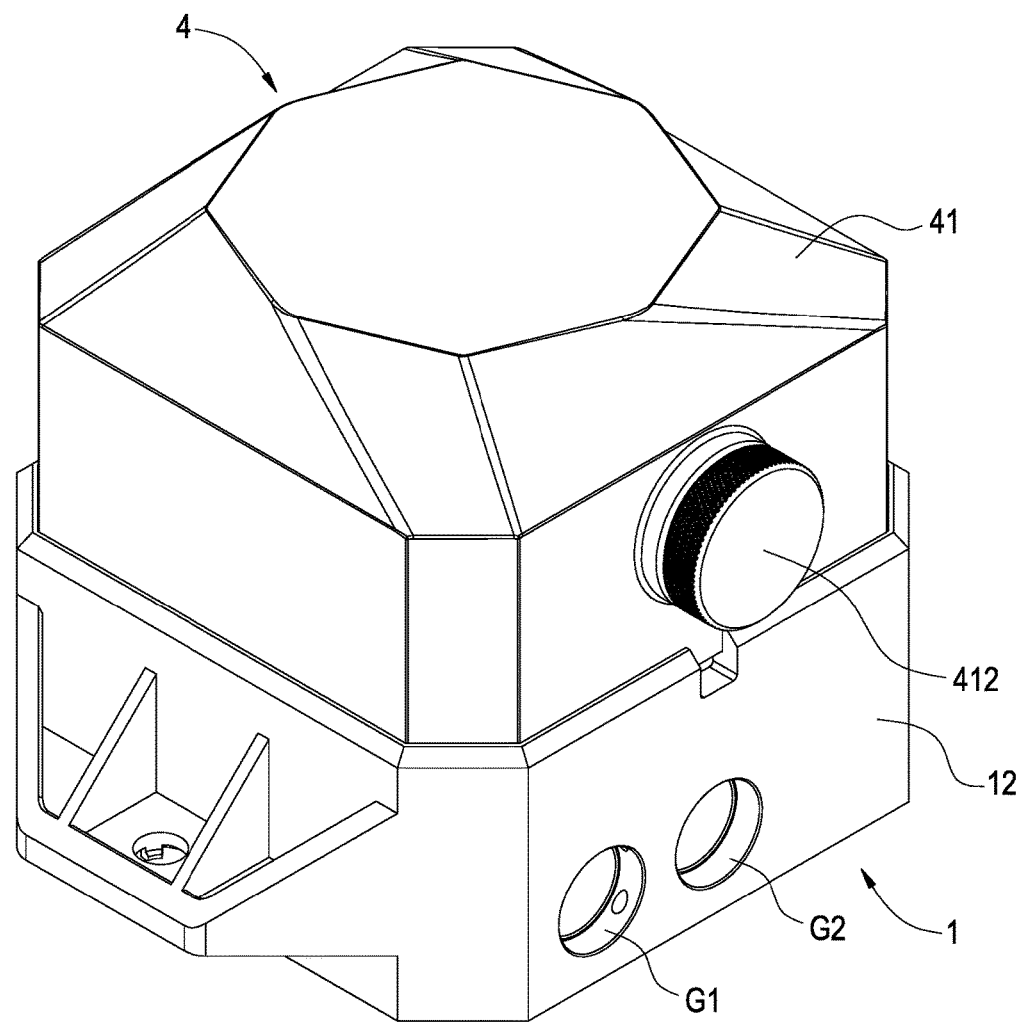
FIG. 8 is an assembly appearance view the second embodiment of the present invention.
Figure 9:
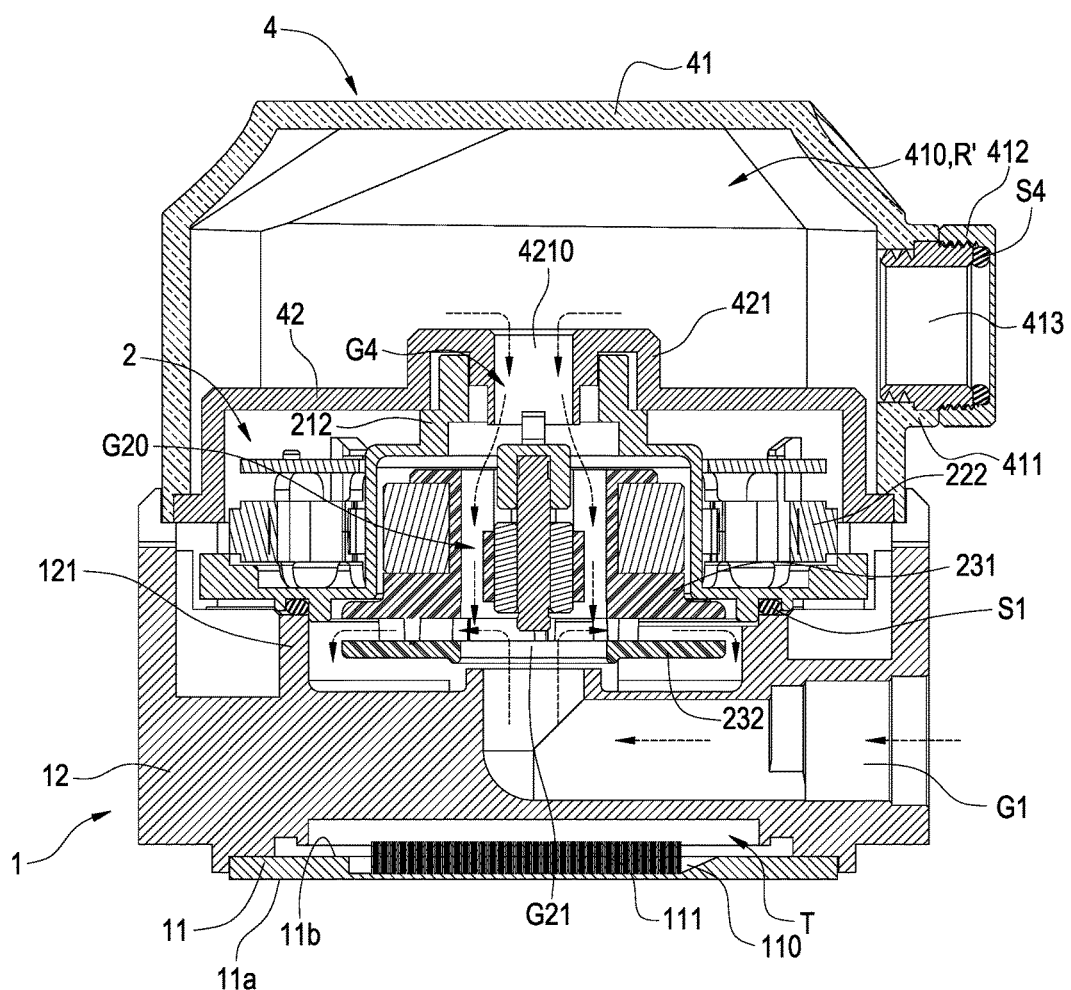
FIG. 9 is an assembly cross-sectional view of the second embodiment of the present invention.

FIG. 8 and FIG. 9 show a second embodiment of a liquid-cooled heat dissipation apparatus of the present invention provided, and the details of the identical or similar parts thereof with the previously mentioned embodiment are omitted hereafter. The following mainly describes the primary differences between the second embodiment and the previously mentioned embodiment. In this embodiment, the liquid-cooled heat dissipation apparatus comprises the aforementioned water cooling module 1, the aforementioned water pump set 2 and a reservoir tank 4; wherein the reservoir tank 4 is detachable stacked onto the water cooling module 1, and the water pump set 2 is installed between the water cooling module 1 and the reservoir tank 4.

The reservoir tank 4 comprises a housing 41 and a bottom shield 42 attached onto one side of the housing 41 corresponding to the water cooling module 1. In this embodiment, the housing 41 is a cover structure and includes a receiving portion 410 to form a water containing chamber R'. The outer circumferential wall of the housing 41 includes a water supply end 411 protruded thereon, and the water supply end 411 includes an opening formed thereon as a water supply opening 413. The bottom shield 42 corresponds to the geometric shape of the housing 41 to be of a stepped shape and the outer circumferential edge can be welded with the outer circumferential edge of the housing 41, such as the ultrasonic welding method; however, the present invention is not limited to such method only. Furthermore, the outer circumferential edge of the housing 41 abuts against the inner circumferential wall 125 of the base 12 in order to be stacked onto the water cooling module 1 directly. The water supply opening 413 can be mounted with a sealing cap 412 at the water supply end 411 in order to seal the water supply opening 413. The sealing cap 412 can be equipped with screw threads and can use a sealing gasket S4 for sealing the bottom of a hollow tube with outer screw threads fastened to the cap. The hollow tube can then be inserted into the water supply opening 413 for sealing thereof. To be more specific, the water supply end 411 can be arranged at any location of the housing 41, and the drawings only show one embodiment of the arrangement of the water supply end; however, the present invention shall not be limited to the disclosure of such drawings only. Moreover, the housing 41 can made of a transparent material; alternatively, only a portion of the housing 41 can be made transparent.

According to the above, the bottom shield 42 of the stepped structure can be a downward stepped structure extended from a location corresponding to the rotor sleeve 212 toward the direction of the outer circumferential edge of the bottom shield 42; however, the present invention is not limited to such configuration only. In addition, the bottom shield 42 corresponding to the location of the rotor sleeve 212 includes a fitting sleeve 421 and includes a through hole 4210 formed thereon in order to form a water supply channel G4 connected to the aforementioned second channel G20. To be more specific, the fitting sleeve 421 includes a groove structure formed at one side corresponding to the rotor sleeve 212, and the reservoir tank 4 uses the groove structure for inserting into the rotor sleeve 212 in order to allow the rotor sleeve 212 to abut against the inner wall of the groove structure for positioning thereof. In this embodiment, the user can simply rotate the sealing cap 412 to open the cap in order to perform the water supply operation. The cooling water then enters from the water supply channel G4 and passes through the second channel G20 to enter into the circulation cooling loop in order to perform the cooling circulation such that it is able to achieve the same functions and effects as the ones of the previously mentioned embodiment.

Figure 2:
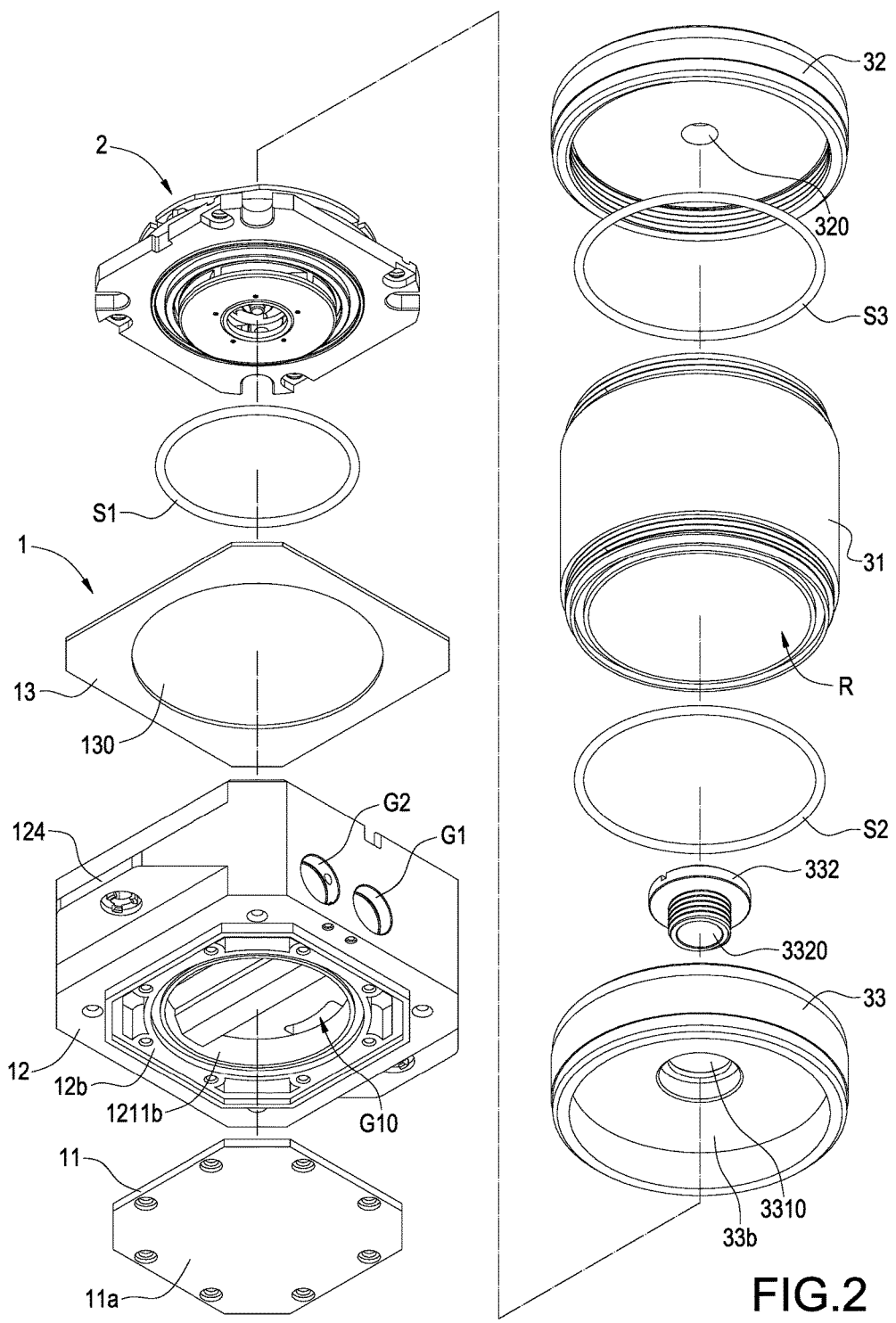
FIG. 2 is another perspective exploded view of the first embodiment of the present invention viewed from another angle.
Figure 10:
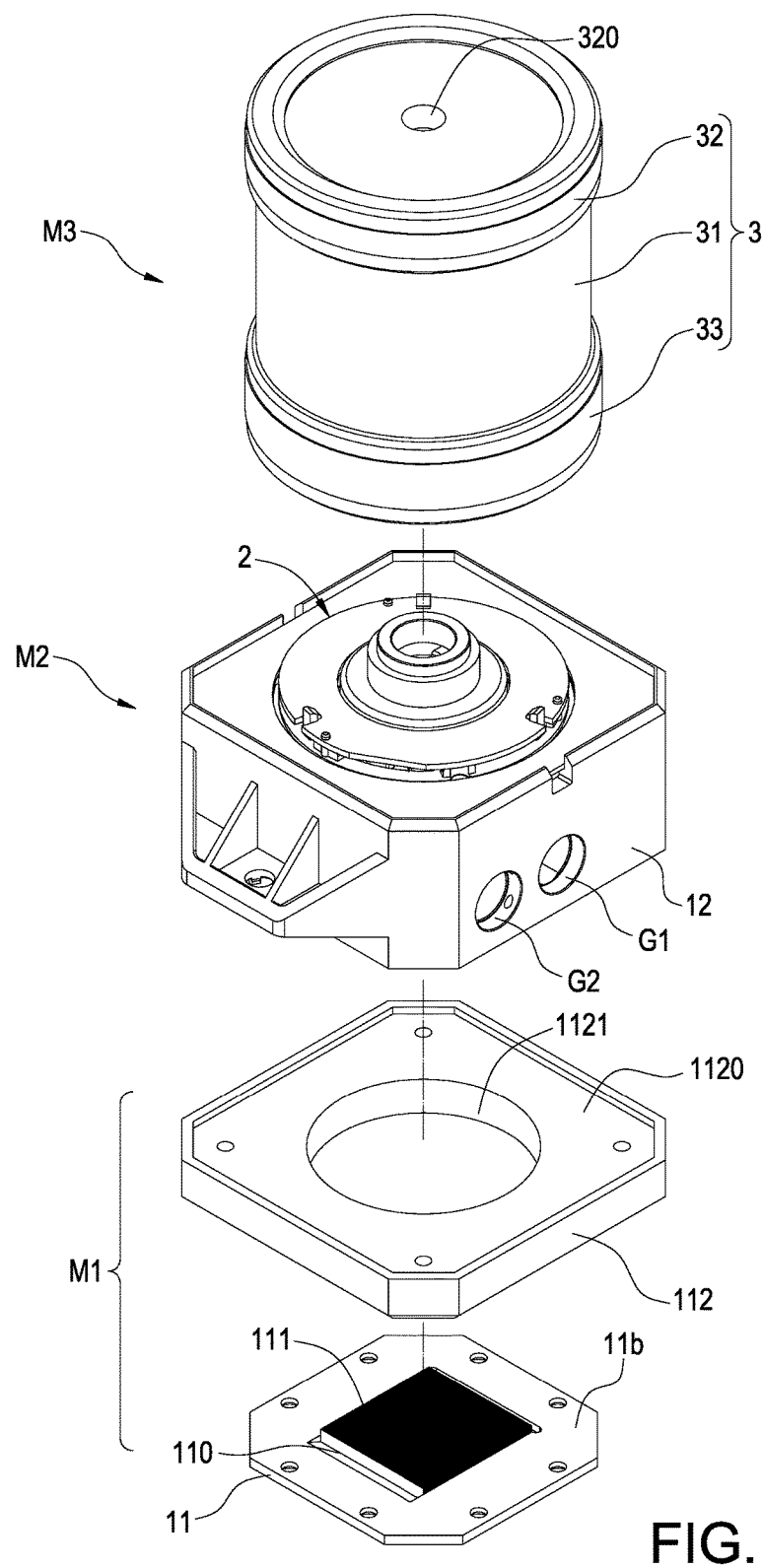
FIG. 10 is a perspective exploded view of the third embodiment of the present invention.
Figure 11:
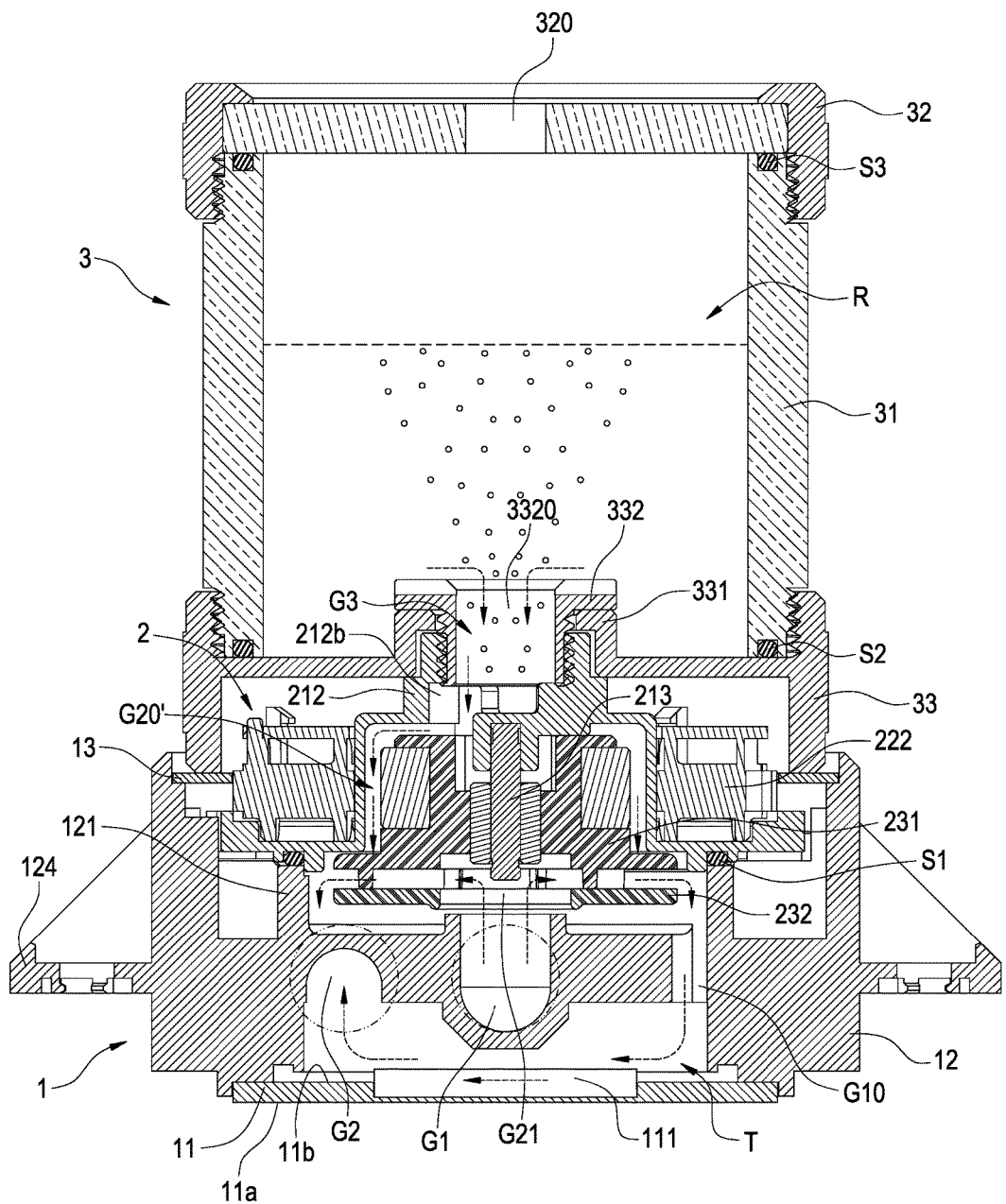
FIG. 11 is an assembly cross-sectional view of the fourth embodiment of the present invention.

FIG. 1, FIG. 2 and FIG. 10 show a third embodiment of a liquid-cooled heat dissipation apparatus of the present invention provided, and the details of the identical or similar parts thereof with the previously mentioned embodiments are omitted hereafter. The following mainly describes the primary differences between the third embodiment and the previously mentioned embodiments. In this embodiment, the primary difference relies in that the water cooling module 1 further comprises a carrier seat 112 attached onto the aforementioned metal plate 11. The carrier seat 112 is disposed between the heat exchange unit 11 and the base 12, and it further includes a carrying surface 1120. The outer circumferential edge of the carrying surface 1120 is formed to protrude out of the outer ring wall of the carrying surface 112, and the carrying surface 112 includes a channel hole 1121 formed at a location corresponding to the cavity 1211b of the base 12; in addition, the other side of the carrier seat 112 uses the plurality of holes formed on the aforementioned heat exchange unit for securement thereof. Moreover, the cross-sectional area of the channel hole 1121 matches with the cross-sectional area of the cavity 1211b. The outer surrounding of the channel hole 1121 includes a plurality of holes formed corresponding to the locations of the positioning portions 123 in order to allow screws to penetrate through the positioning portions 123 and the plurality of holes formed on the carrier seat 112 for attachment and securement thereof. The channel hole 1121 is connected to the cavity 1211b in order to jointly form the heat exchange chamber T. In this embodiment, the carrier seat 112 is attached to the metal plate 11 to form an independent module M1, the base 12 is attached to the water pump set 2 to form an independent module M2, and the reservoir tank 3 is an independent module M3. In addition, such independent modules mentioned above can be of a separated or assembled modularization design in order to cope with different design needs for the aforementioned modules, which can also achieve the same functions and effects as the ones of the previous mentioned embodiments respectively.

FIG. 1 to FIG. 4 and FIG. 11 show a fourth embodiment of a liquid-cooled heat dissipation apparatus of the present invention provided, and the details of the identical or similar parts thereof with the previously mentioned embodiments are omitted hereafter. The following mainly describes the primary differences between the fourth embodiment and the previously mentioned embodiments. In this embodiment, the primary difference relies in that the blade seat 231 of the blade assembly 23 is not formed of the plurality of channel holes 2311 penetrating through the blade seat 231; however, the inner circumferential wall of the axle receiving slot 2310 still includes the plurality of inner ratchet portions 2312 similarly. In addition, the outer diameter of the blade seat 23 is reduced in order to allow an appropriate gap to be formed between the blade seat 23 and the inner circumferential wall of the sleeve slot 212b such that a ring space formed by the aforementioned gap between the two is able to connect to the internal of the pump receiving slot 12 in order to form a second channel G20'. Identical to the previously mentioned embodiments, the second channel G20' in this embodiment is also connected to the water containing chamber R via the water supply channel G3 as well as connected to the internal of the pump receiving slot 121, the first channel G10, the water inlet channel G1 and the drainage channel G2 in order to increase the cooling exchange efficiency in the cooling circulation loop. This embodiment is also able to achieve the same functions and effects as the ones of the previously mentioned embodiments respectively.

Figure 13:
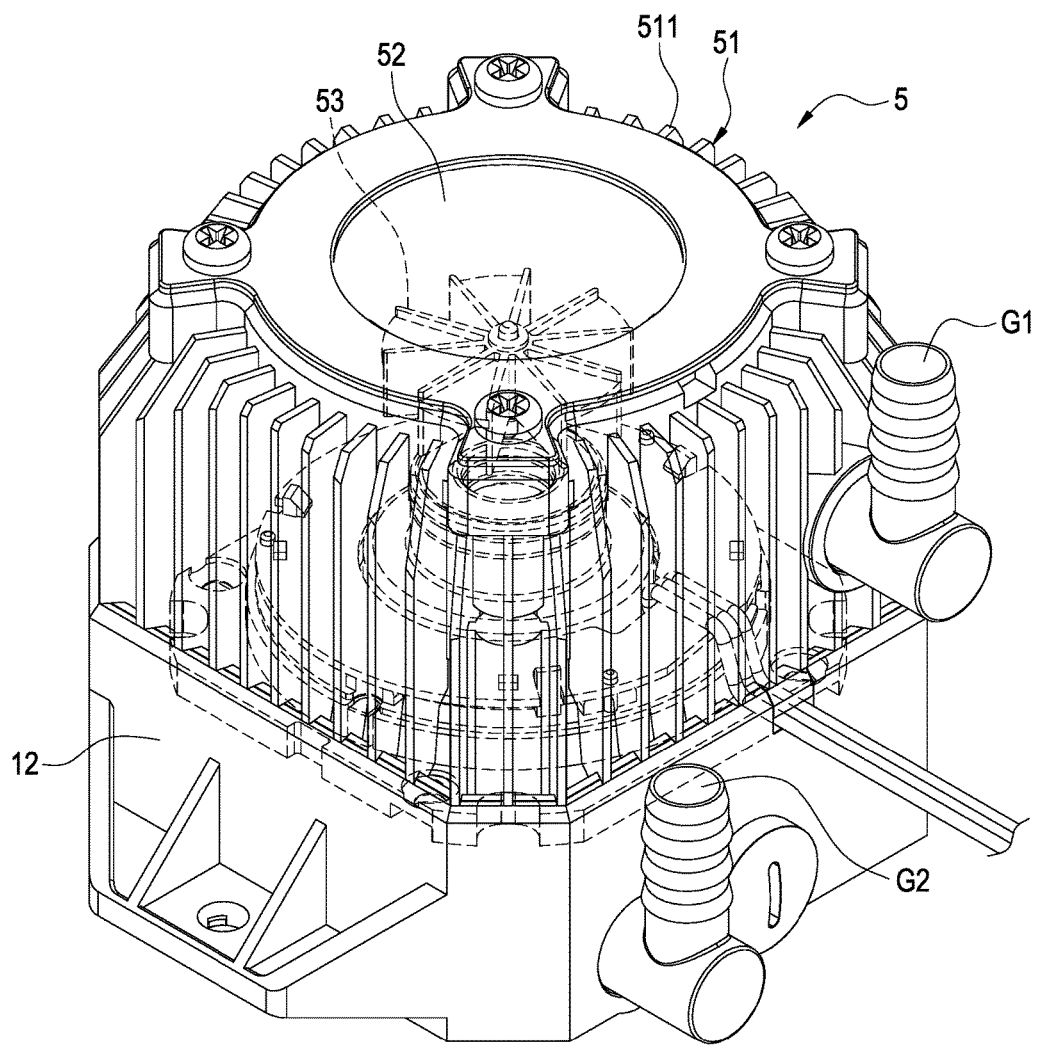
FIG. 13 is an assembly appearance view the fifth embodiment of the present invention.
Figure 14:
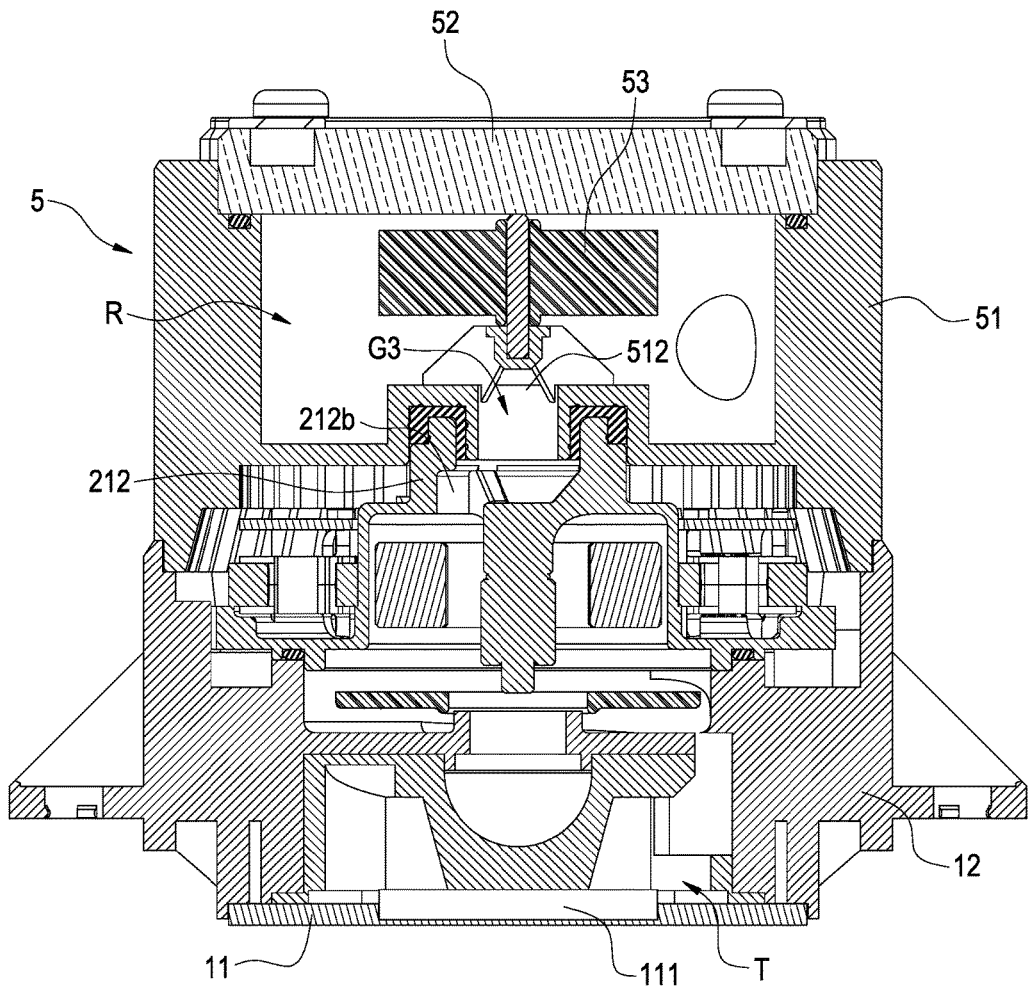
FIG. 14 is an assembly cross-sectional view of the fifth embodiment of the present invention.
Figure 15:
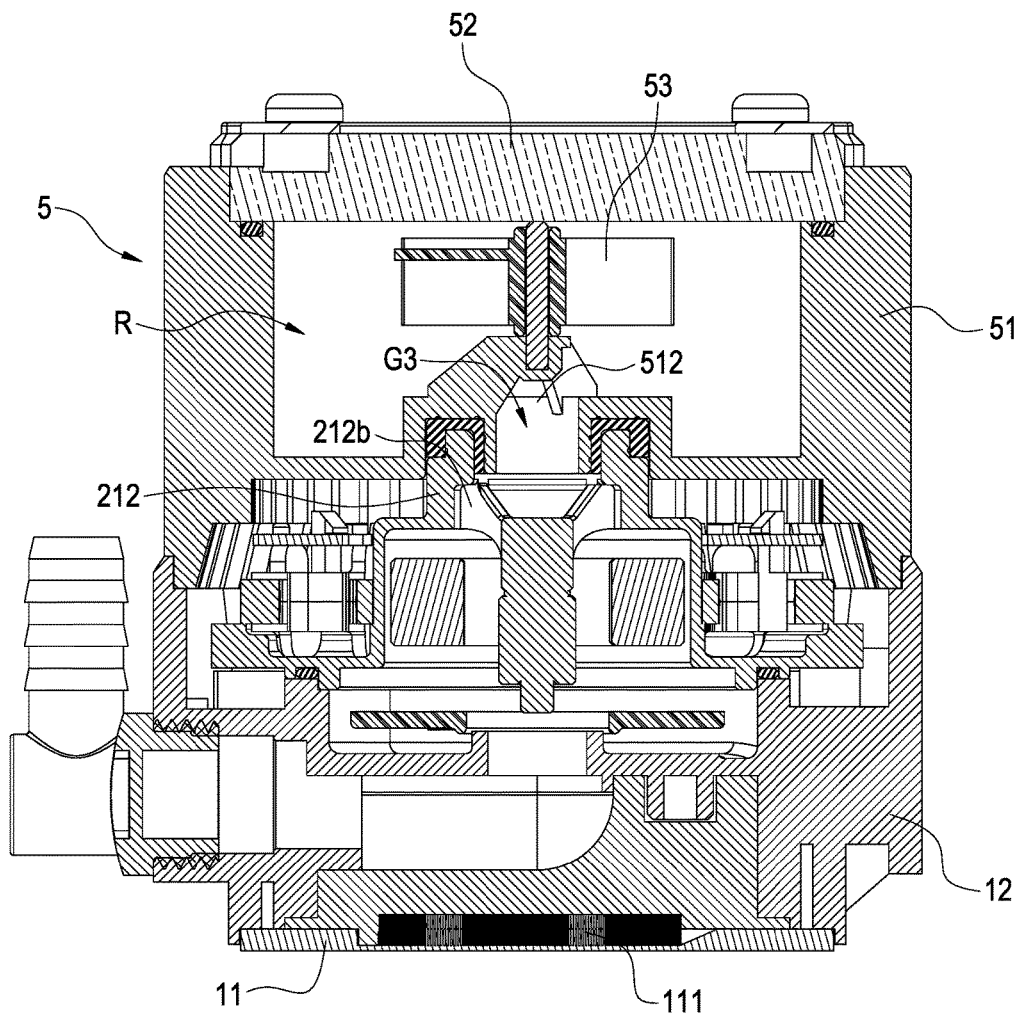
FIG. 15 is another assembly cross-sectional view of the fifth embodiment of the present invention.

FIG. 13 to FIG. 15 show a fifth embodiment of a liquid-cooled heat dissipation apparatus of the present invention provided. In this embodiment, the primary difference from the previously mentioned embodiments mainly relies in that the reservoir tank 5 comprises a housing 51, a top cap 52 and a passive blade wheel 53. In this embodiment, the housing 5 is made of an extruded material of aluminum alloy etc. The outer surface of the housing 51 includes a plurality of cooling fins 511 extended outward therefrom, and a through hole 512 is formed at the internal of the housing 51. The through hole 512 is connected to the attachment slot 212b of the rotor sleeve 212 in order to form a water supply channel G3. The top cap 52 is made of a transparent material and is correspondingly attached onto one end of the housing 51 away from the water pump set 2. The passive blade wheel 53 is installed on top of the water supply channel G3 and is formed at the internal of the water containing chamber R; wherein the water inlet channel G1 as mentioned in the previous embodiments is arranged at one side of the housing 51 and is connected to the water containing chamber R in order to allow the cooling water to enter into the internal of the pump receiving slot 121 via the water inlet channel G1, followed by utilizing the flow of the cooling water to drive the passive blade wheel 53 to rotate, and the operation status of the water flow at the internal thereof can be viewed from the top cap 52 directly.

In view of the above, the embodiments of the present invention disclosed shall be considered to illustrate the present invention only rather than to limit the present invention. The scope of the present invention shall be determined based on the claims defined hereafter, and the scope of the present invention shall cover all equivalent modifications such that it shall not be limited to the descriptions provided above.

What is claimed is:

1. A liquid-cooled heat dissipation apparatus, comprising:
a water cooling module (1), comprising:
a base (12) having one side formed of a pump receiving slot (121) and another side connected to a heat exchange unit (11) and a heat exchange chamber (T) formed with the heat exchange unit (11); the base (12) having a drainage channel (G2) connected to the heat exchange chamber (T) and a first channel (G10) connected to an internal of the pump receiving slot (121) and the heat exchange chamber (T);
a water pump set (2) arranged inside the pump receiving slot (121); the water pump set (2) comprising a rotor assembly (21) and a blade assembly (23) connected to the rotor assembly (21) for power transmission; the blade assembly (23) attached onto the rotor assembly (21) and forming a second channel (G20) together with the blade assembly (23) in order to connect to an internal of the pump receiving slot (121);
a reservoir tank (3) detachably stacked onto a top side of the water cooling module (1) with the pump receiving slot (121) formed thereon; the reservoir tank (3) having a water containing chamber (R) and a water supply channel (G3) connected to the water containing chamber (R); the water supply channel (G3) connected to the second channel (G20),
wherein the water cooling module (1) is disposed outside of the reservoir tank (3); and
wherein the reservoir tank (3) comprises a housing (31), a bottom shield (33), and a top shield (32); the bottom shield is disposed on a bottom side of the reservoir tank (3) and covers a top surface of the water pump set (2), so that the water pump set (2) is sandwiched between the reservoir tank (3) and the water cooling module (1).

2. The liquid-cooled heat dissipation apparatus according to claim 1, wherein the rotor assembly (21) comprises a rotor seat (211) and a rotor sleeve (212) arranged to protrude on the rotor seat (211); one side of the rotor sleeve (212) include a sleeve hole (212a) formed thereon and a rotating axle (213) is arranged inside the rotor sleeve (212); the blade assembly (23) comprises a blade seat (231) and a blade disk (232) connected to the blade seat (231); the blade assembly (23) is attached onto the rotor sleeve (212) with the blade seat (231) and the blade disk (232) is axially connected to the rotating axle (213); the blade seat (231) includes at least one channel hole (2311) penetrating through the blade seat (231); an internal of the rotor sleeve (212) and the channel hole (2311) together form the second channel (G20).

3. The liquid-cooled heat dissipation apparatus according to claim 2, wherein the base (12) further includes a water inlet channel (G1) connected to an internal of the pump receiving slot (121); the pump receiving slot (121) includes a fitting sleeve (1211) disposed therein; the fitting sleeve (1211) includes a sleeve hole (1211a) formed thereon and the blade disk (232) includes a blade through hole (2320) formed thereon; the blade through hole (2320) and the sleeve hole (1211a) together form a third channel (G21) connected to the second channel (G20) and the water inlet channel (G1).

4. The liquid-cooled heat dissipation apparatus according to claim 2, wherein the reservoir tank (4) comprises a housing (41) made of a transparent material and a bottom shield (42) attached onto the housing (41); the housing (41) is a cover structure and includes a water supply opening (413) formed thereon; the water supply opening (413) is formed at any one side of an outer circumferential wall of the housing (41) and includes a sealing cap (412) for sealing the water supply opening (413).

5. The liquid-cooled heat dissipation apparatus according to claim 4, wherein the bottom shield (42) includes a fitting sleeve (421) for the rotor sleeve (212) to be inserted therein, and the fitting sleeve (421) includes a fitting through hole (4210) to form the water supply channel (G3); the water supply channel (G3) is connected to the water containing chamber (R) and the second channel (G20).

6. The liquid-cooled heat dissipation apparatus according to claim 2, wherein the housing (31) is a hollow tubular member having openings formed at two ends thereof; one opening end of the hollow tubular member is attached onto the bottom shield (33) and another opening end thereof is a water supply opening (310) and is attached with the top shield (32) for sealing thereof; the bottom shield (33) includes a fitting sleeve (331) for the rotor sleeve (212) to be mounted therein; the fitting sleeve (331) includes a fitting through hole (3310) and uses a fastening member (332) penetrating through the fitting through hole (3310) in order to fasten the rotor assembly (21); the fastening member (332) includes a fitting through hole (3320) to form the water supply channel (G3); the water supply channel (G3) is connected to the water containing chamber (R) and the second channel (G20).

7. The liquid-cooled heat dissipation apparatus according to claim 2, wherein the blade seat (231) includes an axle receiving slot (2310) for the rotating axle (213) to penetrate therethrough in order to axially connect to the blade disk (232); an inner circumferential wall of the axle receiving slot (2310) includes at least one inner ratchet portion (2312).

8. The liquid-cooled heat dissipation apparatus according to claim 1, wherein the rotor assembly (21) comprises a rotor seat (211) and a rotor sleeve (212) arranged to protrude on the rotor seat (211); one side of the rotor sleeve (212) include a sleeve hole (212a) formed thereon and a rotating axle (213) is arranged inside the rotor sleeve (212); the blade assembly (23) comprises a blade seat (231) and a blade disk (232) connected to the blade seat (231); the blade assembly (23) is mounted onto the rotor sleeve (212) with the blade seat (231) and the blade disk (232) is axially connected to the rotating axle (213); a gap is formed between the blade seat (231) and the rotor sleeve (212) in order to form the second channel (G20').

9. The liquid-cooled heat dissipation apparatus according to claim 8, wherein the reservoir tank (4) comprises a housing (41) made of a transparent material and a bottom shield (42) attached onto the housing (41); the housing (41) is a cover structure and includes a water supply opening (413) formed thereon; the water supply opening (413) is formed at any one side of an outer circumferential wall of the housing (41) and includes a sealing cap (412) for sealing the water supply opening (413).

10. The liquid-cooled heat dissipation apparatus according to claim 9, wherein the bottom shield (42) includes a fitting sleeve (421) for the rotor sleeve (212) to be inserted therein, and the fitting sleeve (421) includes a fitting through hole (4210) to form the water supply channel (G3); the water supply channel (G3) is connected to the water containing chamber (R) and the second channel (G20').

11. The liquid-cooled heat dissipation apparatus according to claim 8, wherein the reservoir tank (3) comprises a housing (31) made of a transparent material and a bottom shield (33) and a top shield (32) attached onto the housing (31); the housing (31) is a hollow tubular member having openings formed at two ends thereof; one opening end of the hollow tubular member is attached onto the bottom shield (33) and another opening end thereof is a water supply opening (310) and is attached with the top shield (32) for sealing thereof; the bottom shield (33) includes a fitting sleeve (331) for the rotor sleeve (212) to be mounted therein; the fitting sleeve (331) includes a fitting through hole (3310) and uses a fastening member (332) penetrating through the fitting through hole (3310) in order to fasten the rotor assembly (21); the fastening member (332) includes a fitting through hole (3320) to form the water supply channel (G3); the water supply channel (G3) is connected to the water containing chamber (R) and the second channel (G20').

12. The liquid-cooled heat dissipation apparatus according to claim 8, wherein the blade seat (231) includes an axle receiving slot (2310) for the rotating axle (213) to penetrate therethrough in order to axially connect to the blade disk (232); an inner circumferential wall of the axle receiving slot (2310) includes at least one inner ratchet portion (2312).

13. The liquid-cooled heat dissipation apparatus according to claim 1, wherein the heat exchange unit (11) is a metal plate; the metal plate includes a plurality of fins (111) formed at one side corresponding to the base (12) and arranged spaced apart from each other in parallel; the base (12) includes a cavity (1211b) formed at one side corresponding to the heat exchange unit (11) in order to form the heat exchange chamber (T).

14. The liquid-cooled heat dissipation apparatus according to claim 1, wherein the heat exchange unit (11) comprises a metal plate and a carrier seat (112) attached onto the metal plate and the base (12) respectively; the metal plate includes an indented slot (110) formed at one side corresponding to the base (12), and a bottom surface of the indented slot (110) includes a plurality of fins (111) formed thereon and arranged spaced apart from each other in parallel; the base (12) includes a cavity (1211b) formed at one side corresponding to the heat exchange unit (11); the carrier seat (112) includes a channel hole (1121) penetrating through the carrier seat (112), and the channel hole (1121) is connected to the cavity (1211b) to form the heat exchange chamber (T).

15. The liquid-cooled heat dissipation apparatus according to claim 1, wherein the reservoir tank (5) comprises a housing (51), a top cap (52) and a passive blade wheel (53); the top cap (52) is made of a transparent material, and the top cap (52) is attached to one end of the housing (51) correspondingly; the passive blade wheel (53) is installed on top of the water supply channel (G3) and is formed inside the water containing chamber (R).

16. The liquid-cooled heat dissipation apparatus according to claim 15, wherein the housing (51) includes a water inlet channel (G1) formed on one side thereof and connected to the water containing chamber (R).

* * * * *